United States Patent
Xia et al.

(10) Patent No.: US 11,264,439 B2
(45) Date of Patent: Mar. 1, 2022

(54) ORGANIC LIGHT-EMITTING DIODE ARRAY SUBSTRATE AND METHOD OF MANUFACTURING THE SAME

(71) Applicant: Wuhan China Star Optoelectronics Semiconductor Display Technology Co., Ltd., Hubei (CN)

(72) Inventors: Cunjun Xia, Hubei (CN); Xingyong Zhang, Hubei (CN)

(73) Assignee: Wuhan China Star Optoelectronics Semiconductor Display Technology Co., Ltd.

(*) Notice: Subject to any disclaimer, the term of this patent is extended or adjusted under 35 U.S.C. 154(b) by 271 days.

(21) Appl. No.: 16/500,708

(22) PCT Filed: Jun. 12, 2019

(86) PCT No.: PCT/CN2019/090973
§ 371 (c)(1),
(2) Date: Oct. 3, 2019

(87) PCT Pub. No.: WO2020/215461
PCT Pub. Date: Oct. 29, 2020

(65) Prior Publication Data
US 2021/0335934 A1 Oct. 28, 2021

(30) Foreign Application Priority Data
Apr. 22, 2019 (CN) .......................... 201910322930.1

(51) Int. Cl.
*H01L 27/32* (2006.01)
*H01L 51/56* (2006.01)

(52) U.S. Cl.
CPC ...... *H01L 27/3246* (2013.01); *H01L 27/3258* (2013.01); *H01L 27/3262* (2013.01); *H01L 51/56* (2013.01); *H01L 2227/323* (2013.01)

(58) Field of Classification Search
CPC ............. H01L 27/3246; H01L 27/3283; H01L 51/5221; H01L 51/5225; H01L 51/5237–5259
See application file for complete search history.

(56) References Cited

U.S. PATENT DOCUMENTS

2019/0229152 A1  7/2019  Wang
2020/0066815 A1  2/2020  Choi et al.
(Continued)

FOREIGN PATENT DOCUMENTS

CN  107968107 A  4/2018
CN  108649057 A  10/2018
(Continued)

*Primary Examiner* — Bryan R Junge
(74) *Attorney, Agent, or Firm* — Taft Stettinius & Hollister LLP

(57) ABSTRACT

An organic light-emitting diode (OLED) array substrate and a method of manufacturing the same are disclosed. The OLED array substrate includes a substrate, a thin-film transistor layer, an insulating layer, an anode layer, and a pixel defining layer, wherein the pixel defining layer has a first slot and a second slot. A light-emitting layer is formed in the first slot, and a plurality of fillers are provided in the second slot to form a plurality of discontinuous slots in the second slot for forming a plurality of discontinuous cathode layers. When the cathodes on the surface of the pixel defining layer away from the display area are corroded, the function of the cathodes in the display area would not be affected in such a manner that the display effect of the display device would not be affected.

13 Claims, 8 Drawing Sheets

(56) References Cited

U.S. PATENT DOCUMENTS

| | | | |
|---|---|---|---|
| 2020/0083306 A1* | 3/2020 | Choi | H01L 51/5246 |
| 2020/0185468 A1 | 6/2020 | Zhang | |
| 2020/0258959 A1 | 8/2020 | Mao et al. | |
| 2020/0266352 A1* | 8/2020 | Kubota | H01L 51/5253 |
| 2020/0303478 A1* | 9/2020 | Lee | H01L 27/3258 |
| 2020/0313102 A1* | 10/2020 | Kim | H01L 27/3258 |

FOREIGN PATENT DOCUMENTS

| | | |
|---|---|---|
| CN | 109103215 A | 12/2018 |
| CN | 109616580 A | 4/2019 |
| WO | 2018212960 A1 | 11/2018 |

* cited by examiner

ORGANIC LIGHT-EMITTING DIODE ARRAY SUBSTRATE AND METHOD OF MANUFACTURING THE SAME

CROSS-REFERENCE TO RELATED APPLICATIONS

This application is a U.S. National Phase of International PCT Application No. PCT/CN2019/090973 filed Jun. 12, 2019, which claims the benefit of Chinese Patent Application Serial No. 201910322930.1 filed Apr. 22, 2019, the contents of each application are incorporated herein by reference in their entirety.

FIELD OF INVENTION

The present invention relates to the organic light-emitting diode (OLED) array substrate and method of manufacturing the same, and in particular, to an OLED array substrate and a method of manufacturing the same suitable for narrow bezel panel design.

BACKGROUND OF INVENTION

Compared with liquid crystal displays, active matrix organic light-emitting diodes (AMOLEDs) have advantages of high contrast, wide viewing angle, high response speed for moving images, so that the AMOLEDs attract people's attention and have developed. With expansion of OLED application fields, new application fields require more full screens of flexible OLED displays, and the full screens of flexible OLED displays may have more and more requirements, such as OLED display bending service life, narrow bezels, etc. Thin film encapsulations for OLED devices and narrowing bezels as much as possible are required for the full screens of flexible OLED displays. However, narrowing lower bezels of the OLED displays are big challenges in the bezels of the OLED displays.

Cathodes of the OLED devices need to be encapsulated in the boundary of the thin film encapsulations, and the cathodes of the OLED devices are restricted by errors of masks of about ±100 µm, and thus the area to be covered by the thin film encapsulations cannot be effectively contracted and narrowed, which are the big challenges in the lowering bezels of the OLED displays. That is, narrowing lower bezels may result in poor cathode encapsulation, ease of corrosion, and ease of overflow of encapsulated organic layer from barricades.

In view of the above, there is a need to provide an improved OLED array substrate and a method of manufacturing the same to overcome the above-mentioned problems.

SUMMARY OF INVENTION

An object of the present invention is to provide an organic light-emitting diode (OLED) array substrate and a method of manufacturing the same. The OLED array substrate has a plurality of discontinuous slots. When the cathodes on the surface of the pixel defining layer away from the display area are corroded, the function of the cathodes in the display area would not be affected in such a manner that the display effect of the display device would not be affected. Moreover, overflow of the encapsulated organic layer can be prevented by forming the organic barricade at the pixel defining layer.

In order to achieve the aforementioned object, the present invention provides a method of manufacturing an OLED array substrate, comprising steps of: providing a substrate, wherein a thin-film transistor (TFT) layer is formed on the substrate, an insulating layer is formed on a portion of the TFT layer, an anode layer is formed on a portion of the insulating layer and is connected to the thin-film transistor layer, and a pixel defining layer is formed on the TFT layer, the insulating layer and the anode layer; removing a portion of the pixel defining layer to form a first slot on the anode layer and forming a second slot beside the first slot; forming a light emitting layer in the first slot, and manufacturing a plurality of fillers in the second slot to form a plurality of discontinuous slots in the second slot; and forming a plurality of cathode layers on the pixel defining layer and in the first slot and the second slot, wherein the plurality of cathode layers are discontinuous cathode layers.

In an embodiment of the present invention, after the step of forming the plurality of cathode layers, the method of manufacturing the OLED array substrate further comprises a step of forming an organic barricade in the discontinuous slots and on the discontinuous slots.

In an embodiment of the present invention, after the step of forming the organic barricade, the method of manufacturing the OLED array substrate further comprises a step of forming an organic layer to cover the first slot and the organic barricade.

In an embodiment of the present invention, the method of manufacturing the OLED array substrate further comprises a step of forming a first inorganic layer on the pixel defining layer, wherein the first inorganic layer covers the plurality of cathode layers and the organic barricade.

In an embodiment of the present invention, after the step of forming the organic layer, the method of manufacturing the OLED array substrate further comprises a step of forming a second inorganic layer on the organic layer, wherein the second inorganic layer covers the organic layer and the first inorganic layer.

In order to achieve the aforementioned object, the present invention provides an OLED array substrate, comprising: a substrate; a TFT layer formed on the substrate; an insulating layer formed on a portion of the TFT layer; an anode layer formed on a portion of the insulating layer and connected to the TFT layer; a pixel defining layer formed on the TFT layer, the insulating layer and the anode layer; wherein the pixel defining layer has a first slot and a second slot, a light emitting layer is formed in the first slot, a plurality of fillers are provided in the second slot, and a plurality of discontinuous slots are formed in the second slot with the plurality of fillers; and a plurality of cathode layers formed on the pixel defining layer and in the first slot and the second slot, wherein the plurality of cathode layers are discontinuous cathode layers.

In an embodiment of the present invention, the first slot and the second slot are in inverted trapezoidal shapes, and the plurality of fillers are in inverted triangular shapes or in inverted trapezoidal shapes.

In an embodiment of the present invention, the OLED array substrate further comprises an organic barricade, and the organic barricade is disposed in the discontinuous slots and on the discontinuous slots.

In an embodiment of the present invention, the OLED array substrate further comprises an organic layer, and the organic layer covers the first slot and the organic barricade.

In an embodiment of the present invention, the OLED array substrate further comprises a first inorganic layer and a second inorganic layer, wherein the first inorganic layer covers the plurality of cathode layers and the organic barricade and the second inorganic layer covers the organic layer and the first inorganic layer.

In order to achieve the aforementioned object, the present invention further provides an OLED array substrate, comprising a substrate; a TFT layer formed on the substrate; an insulating layer formed on a portion of the TFT layer; an anode layer formed on a portion of the insulating layer and connected to the TFT layer; a pixel defining layer formed on the TFT layer, the insulating layer and the anode layer; wherein the pixel defining layer has a first slot and a second slot, and the first slot and the second slot are in inverted trapezoidal shapes; a light emitting layer is formed in the first slot; a plurality of fillers are provided in the second slot, and the plurality of fillers are in inverted triangular shapes or in inverted trapezoid shapes; a plurality of discontinuous slots are formed in the second slot with the plurality of fillers; an organic barricade provided in the discontinuous slots and on the discontinuous slots; and a plurality of cathode layers formed on the pixel defining layer and in the first slot and the second slot, wherein the plurality of cathode layers are discontinuous cathode layers.

In an embodiment of the present invention, the OLED array substrate further comprises an organic layer, and the organic layer covers the first slot and the organic barricade.

In an embodiment of the present invention, the OLED array substrate further comprises a first inorganic layer and a second inorganic layer, wherein the first inorganic layer covers the plurality of cathode layers and the organic barricade and the second inorganic layer covers the organic layer and the first inorganic layer.

The present invention has the beneficial effects that by means of providing slots at the pixel defining layer and disposing a plurality of fillers in the slots to form a plurality of discontinuous slots, a plurality of discontinuous cathode layers can be formed on the pixel defining layer. Accordingly, when the cathodes on the surface of the pixel defining layer away from the display area are corroded, the function of the cathodes in the display area would not be affected in such a manner that the display effect of the display device would not be affected. Thus, the OLED array substrate would not be restricted by the thin film encapsulation layer covering the cathodes at the lower bezel so that a narrower lower bezel can be achieved. Additionally, the convex barricade formed at the pixel defining layer can further prevent the encapsulated organic layer from overflowing.

DETAILED DESCRIPTION OF EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings so that the used directional terms are used to describe and understand the present invention, but the present invention is not limited thereto.

Figure 6:
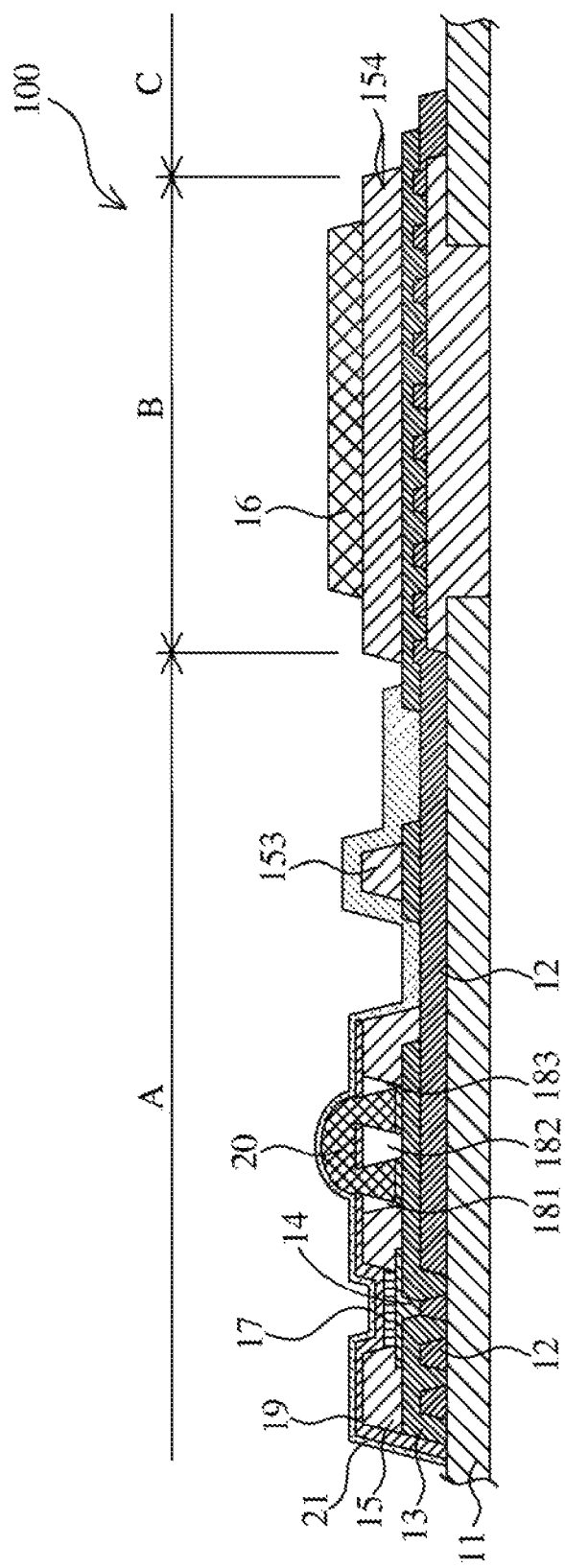
FIG. 6 is a schematic view showing a sixth step of a method of manufacturing an OLED array substrate.
Figure 7:
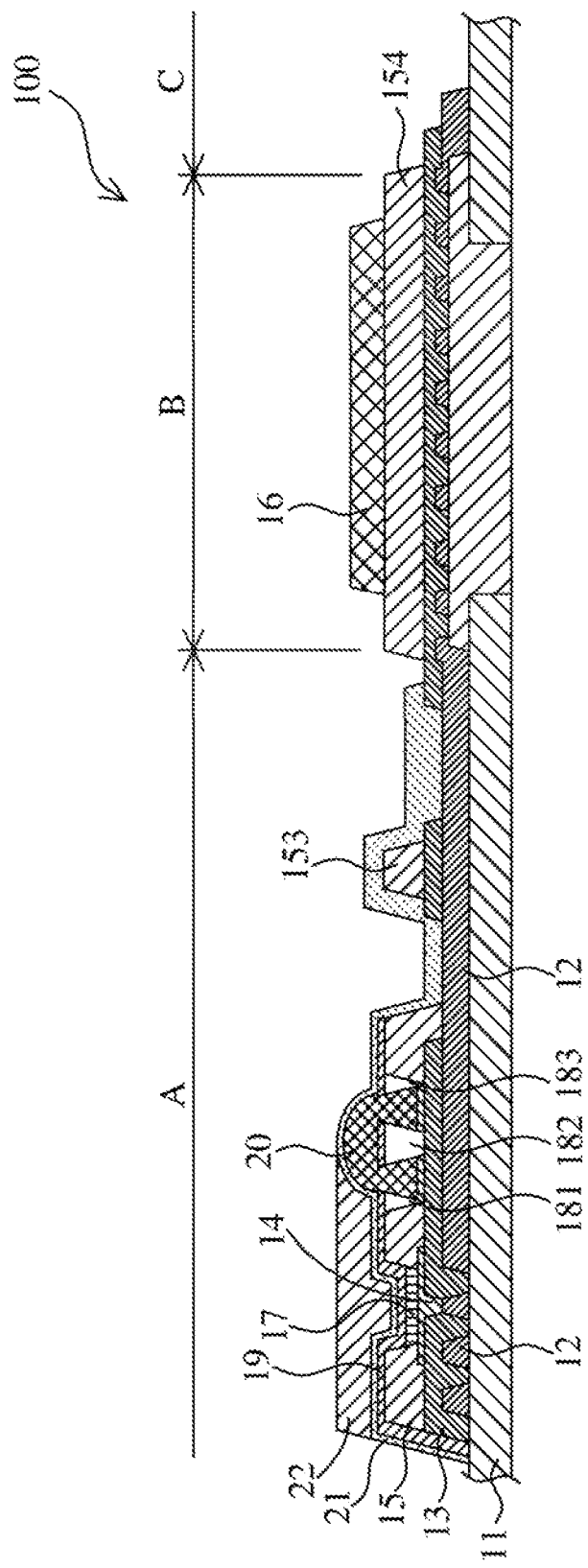
FIG. 7 is a schematic view showing a seventh step of a method of manufacturing an OLED array substrate.
Figure 8:
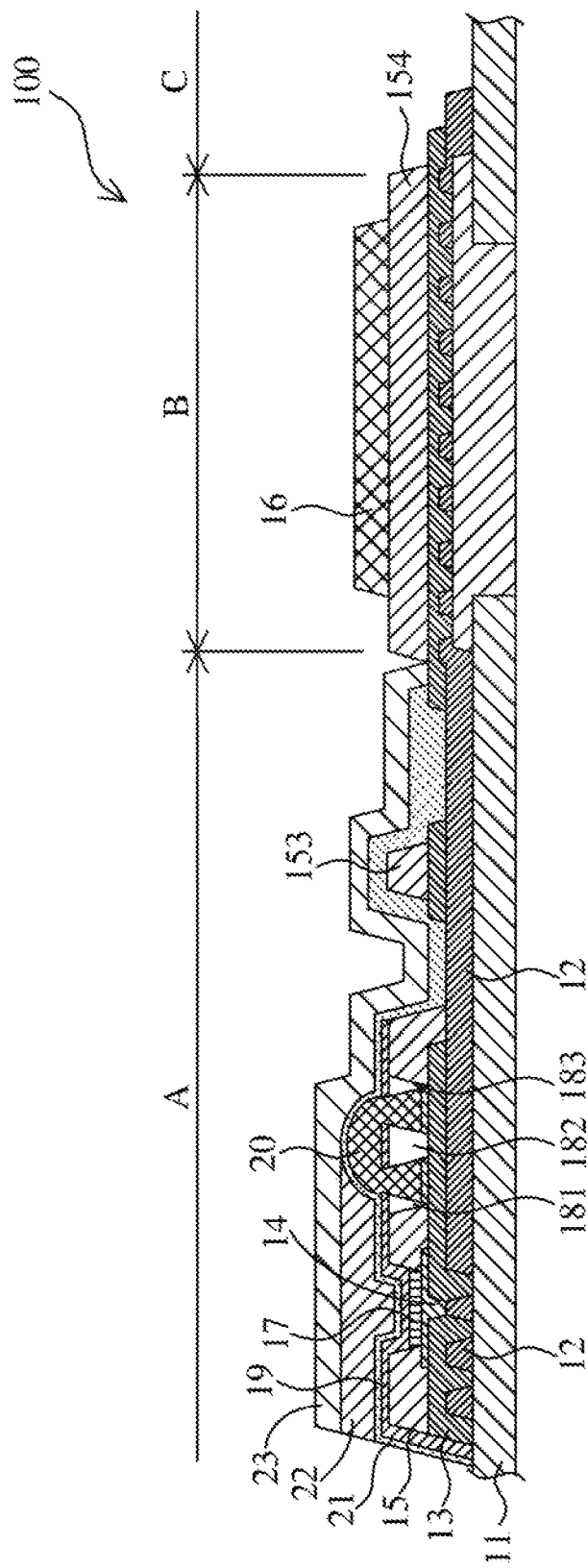
FIG. 8 is a schematic view showing an eighth step of a method of manufacturing an OLED array substrate and structure of an OLED array substrate of the present invention.

Please refer to FIGS. 1-8, which are schematic flowcharts of a method of manufacturing an organic light-emitting diode (OLED) array substrate of the present invention, wherein FIG. 8 is a schematic view of structure of an OLED array substrate of the present invention. It should be noted that, FIGS. 1-8 are partial schematic cross-sectional view showing the bezel portion of the OLED array substrate 100 of the present invention under a panel, which merely show the structure of one pixel closest to the edge of the panel.

Figure 1:
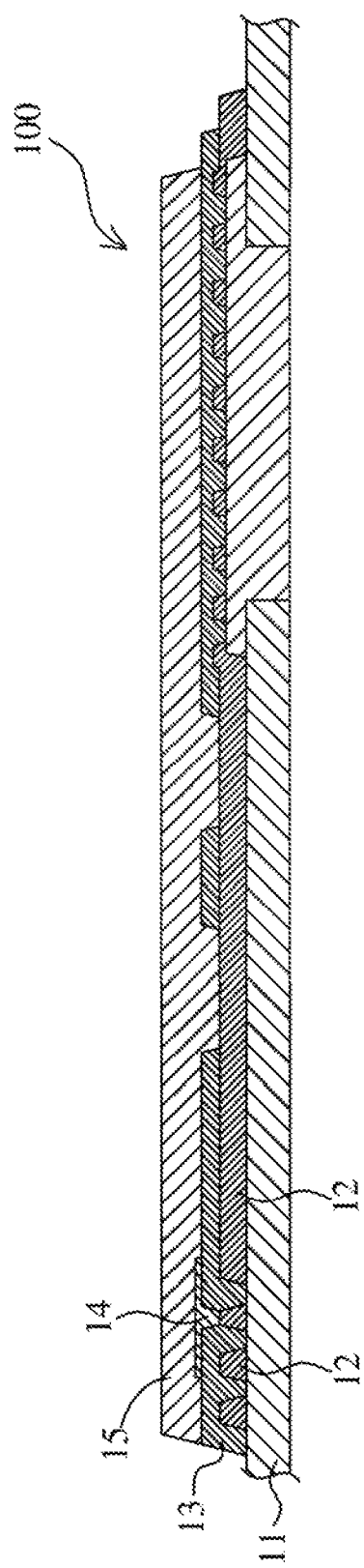
FIG. 1 is a schematic view showing a first step of a method of manufacturing an OLED array substrate.

As shown in FIGS. 1-8, the method of manufacturing the OLED array substrate of the present invention includes the following steps:

Step 1 (as shown in FIG. 1): providing a substrate 11, wherein a thin-film transistor (TFT) layer 12 is formed on the substrate 11, an insulating layer 13 is formed on a portion of the TFT layer 12, an anode layer 14 is formed on a portion of the insulating layer 13 and is connected to the TFT layer 12, and a pixel defining layer 15 is formed on the TFT layer 12, the insulating layer 13 and the anode layer 14.

In this step, the pixel defining layer may be manufactured by a process such as coating, exposure, and development of a photolithography technique.

Figure 2:
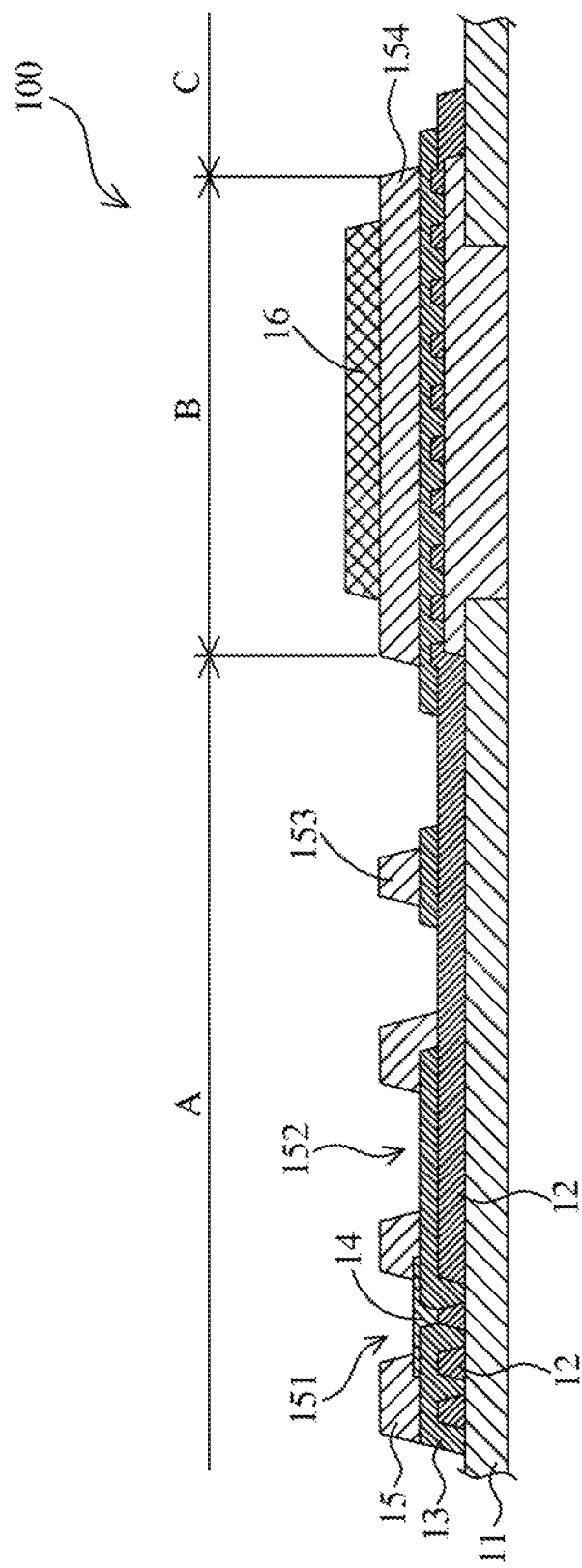
FIG. 2 is a schematic view showing a second step of a method of manufacturing an OLED array substrate.

Step 2 (as shown in FIG. 2): removing a portion of the pixel defining layer 15 to form a first slot 151 on the anode layer 14, forming a second slot 152 beside the first slot 151, forming a first protrusion 153 beside the second slot 152, and forming a second protrusion 154 beside the first protrusion 153.

Specifically, the first slot 151 and the second slot 152 are slots formed by etching the pixel defining layer 15, and the cross sections of the first slot 151 and the second slot 152 are preferably in inverted trapezoidal shapes. The first protrusion 153 and the second protrusion 154 are the remaining portions after two sides of the pixel defining layer 15 are etched and removed, and the cross sections of the first protrusion 153 and the second protrusion 154 are in trapezoidal shapes. So far, the first slot 151 and the second slot 152 still belong to the pixel defining layer 15. However, the first protrusion 153 is independently formed into a barricade, and the second protrusion 154 is independently formed into a plastic layer 16. Thus, the first protrusion 153 and the second protrusion 154 do not belong to the pixel defining layer 15.

In addition, the first slot 151, the second slot 152 and the first protrusion 153 are located at a display area A, and the second protrusion 154 is located at a bending area B. One side of the bending area B is adjacent to the display area A, and the other side of the bending area B is adjacent to a chip area C. After the OLED array substrate 100 is manufactured completely, the bending area B at the lower bezel portion of the panel provides a panel bending function to fold the chip area C below the panel to further reduce the size of the edge of the panel.

In this step, each slot and protrusion on the pixel defining layer may be manufactured by a process such as coating, exposure, and development of a photolithography technique.

Figure 3:
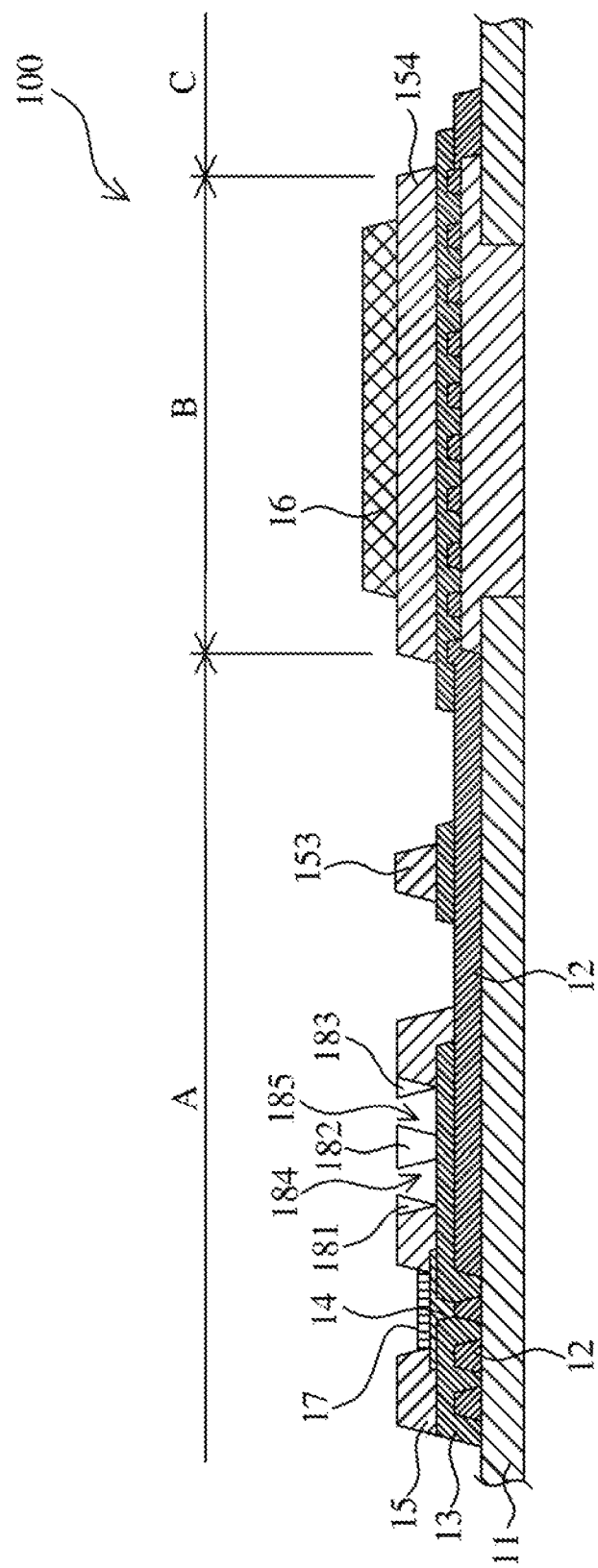
FIG. 3 is a schematic view showing a third step of a method of manufacturing an OLED array substrate.

Step 3 (as shown in FIG. 3): forming a light-emitting layer 17 in the first slot 151, and manufacturing a plurality of fillers 181, 182, 183 in the second slot 152 to form a plurality of discontinuous slots 184, 185 in the second slot 152.

Preferably, the plurality of fillers 181, 183 manufactured at two sides of the second slot 152 are in inverted triangular shapes or in inverted trapezoidal shapes while the plurality of fillers 182 manufactured in the middle of the second slot 152 are in inverted trapezoidal shapes. Thus, the plurality of discontinuous slots 184, 185 in the second slot 152 can be formed in trapezoidal shapes.

In this step, the light-emitting layer may be formed on the pixel defining layer by a thermal evaporation process. Organic fillers may be printed in the slots by using an inkjet printing process, and the organic fillers may be acrylic, epoxy resin, and so on. The height of the organic fillers may be higher than that of the pixel defining layer. The organic fillers are convex, and are cured by UV curing.

Figure 4:
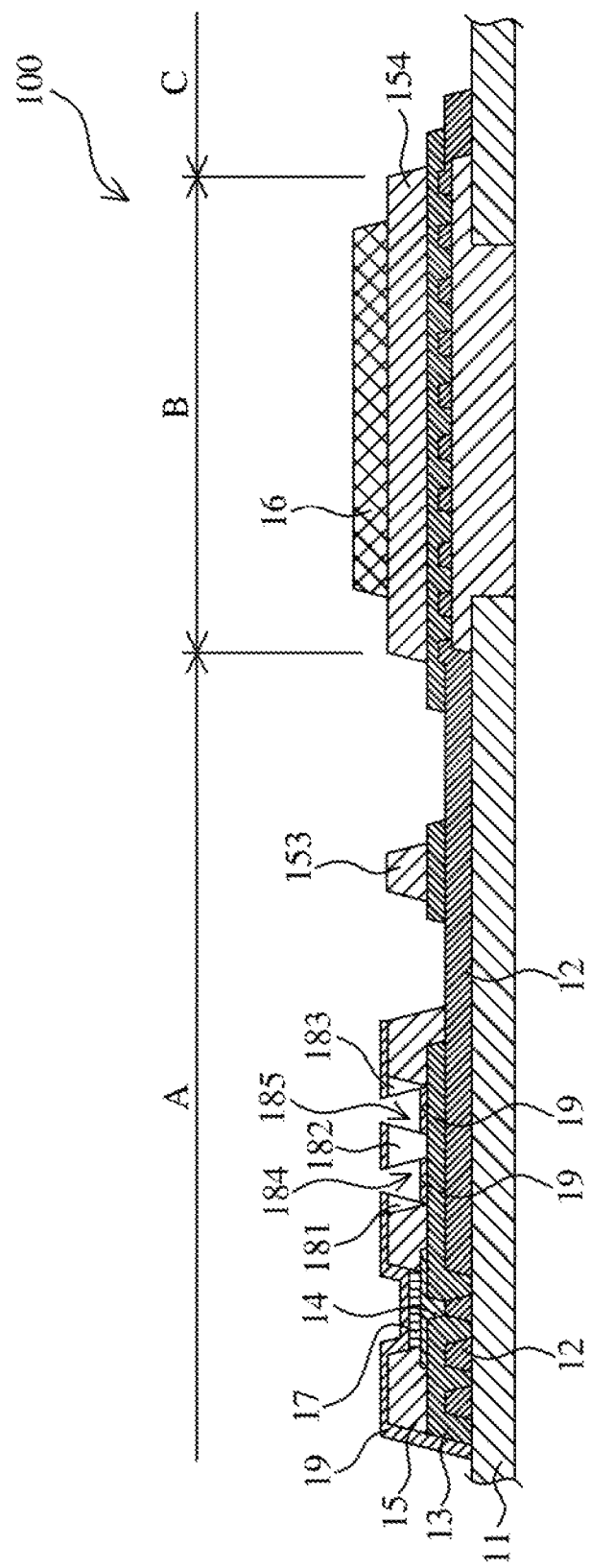
FIG. 4 is a schematic view showing a fourth step of a method of manufacturing an OLED array substrate.

Step 4 (as shown in FIG. 4): forming a plurality of cathode layers 19 on the pixel defining layer 15. The plurality of cathode layers 19 are formed on the pixel defining layer 15 and in the first slot 151 and the second slot 152. Specifically, one cathode layer 19 is respectively formed in the first slot 151 and on the pixel defining layer 15 outside the first slot 151, and the plurality of cathode layers 19 are formed at the surfaces of the plurality of fillers 181, 182, 183 and the bottoms of the plurality of discontinuous slots 184, 185. That is, due to the presences of the discontinuous slots 184, 185, the plurality of discontinuous cathode layers 19 can be manufactured in a single process.

In this step, the cathode layer may be formed on the surface of the light-emitting layer by a thermal evaporation process.

Figure 5:
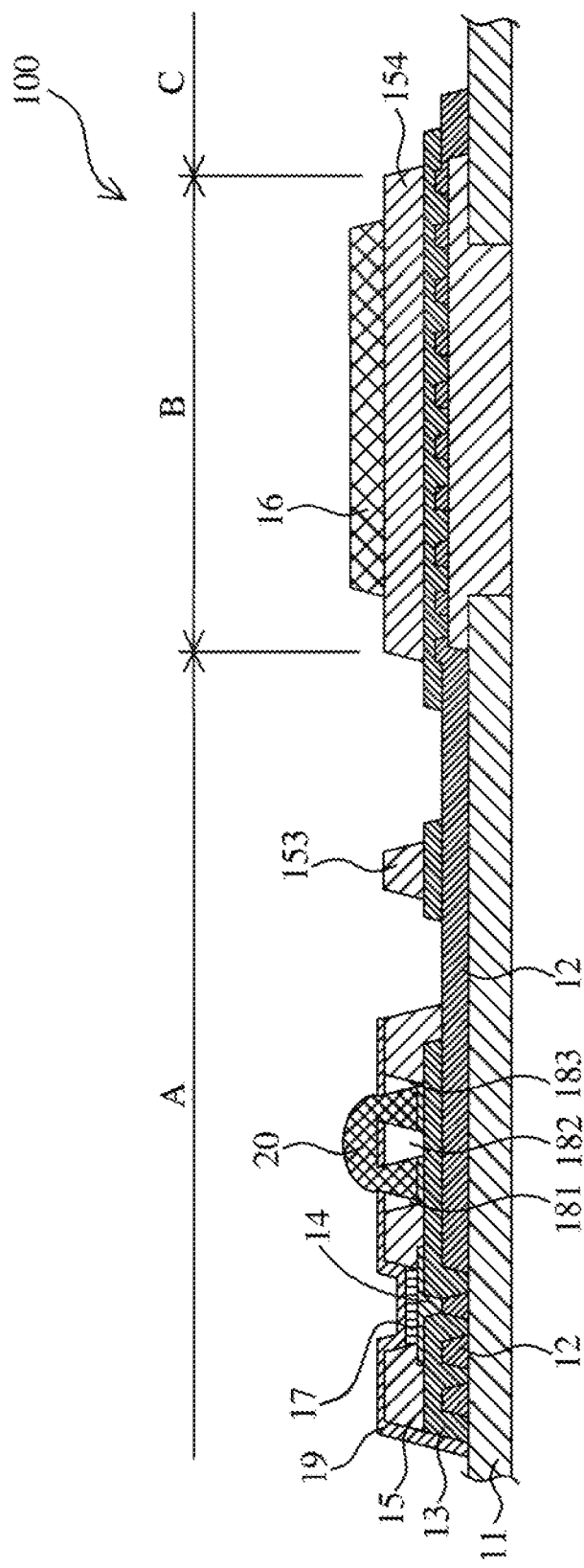
FIG. 5 is a schematic view showing a fifth step of a method of manufacturing an OLED array substrate.

Step 5 (as shown in FIG. 5): forming an organic barricade 20 in the discontinuous slots 184, 185 and on the discontinuous slots 184, 185. The organic barricade 20 is higher than the cathode layer 19, and the top of the organic barricade 20 is in, for example, a circular arc shape.

Step 6 (as shown in FIG. 6): forming a first inorganic layer 21 on the pixel defining layer 15, wherein the first inorganic layer 21 covers the plurality of cathode layers 19 and the organic barricade 20. The first inorganic layer 21 may also cover a portion of the TFT layer and/or the insulating layer 13, and covers the barricade formed by the first protrusion 153 all the while. However, this step can be selectively implemented according to actual needs of a user.

In this step, the surface of the device may be encapsulated by a thin film encapsulation method using a plasma enhanced chemical vapor deposition process and an inkjet printing process, and the inorganic film layer formed by the plasma enhanced chemical vapor deposition process may be silicon nitride, silicon oxynitride, or the like.

Step 7 (as shown in FIG. 7): forming an organic layer 22 on the first inorganic layer 21 above the first slot 151. That is, the organic layer 22 covers an area from the first inorganic layer 21 above the first slot 151 to the organic barricade 20.

In this step, the surface of the device may be encapsulated by a thin film encapsulation method using a plasma enhanced chemical vapor deposition process and an inkjet printing process, and the inorganic film layer formed by the inkjet printing process may be acrylic, epoxy resin, or the like.

Step 8 (as shown in FIG. 8): forming a second inorganic layer 23 on the organic layer 22, wherein the second inorganic layer 23 covers the organic layer 22 and the first inorganic layer 21. The second inorganic layer 23 can further cover the edge of the bending area, including covering the barricade formed by the first protrusion 153. However, this step can be selectively implemented according to actual needs of a user. In addition, the number of layers of the inorganic layer and the organic layer being disposed can also be selected by a user according to actual needs.

In this step, the surface of the device may be encapsulated by a thin film encapsulation method using a plasma enhanced chemical vapor deposition process and an inkjet printing process, and the inorganic film layer formed by the plasma enhanced chemical vapor deposition process may be silicon nitride, silicon oxynitride, or the like.

As mentioned above, an OLED array substrate 100 of the present invention can be manufactured completely by each step of the above-mentioned manufacturing method, the OLED array substrate 100 mainly comprising: a substrate 11, a TFT layer 12, an insulating layer 13, an anode layer 14, and a pixel defining layer 15, wherein the TFT layer 12 is formed on the substrate 11, the insulating layer 13 is formed on a portion of the TFT layer 12, the anode layer 14 is formed on a portion of the insulating layer 13 and is connected to the TFT layer 12, and the pixel defining layer 15 is formed on the TFT layer 12, the insulating layer 13, and the anode layer 14.

Further, the pixel defining layer 15 is manufactured to have a first slot 151 and a second slot 152. A light emitting layer 17 is formed in the first slot 151, and a plurality of fillers 181, 182, 183 are provided in the second slot 152. A plurality of discontinuous slots 184, 185 are formed in the second slot 152 with the plurality of fillers 181, 182, 183.

Further, a plurality of cathode layers 19 are provided on the pixel defining layer 15. The plurality of cathode layers 19 are formed in the first slot 151 and the second slot 152. Specifically, one cathode layer 19 is respectively formed in the first slot 151 and on the pixel defining layer 15 outside the first slot 151, and the plurality of cathode layers 19 are formed at the surfaces of the plurality of fillers 181, 182, 183 and the bottoms of the plurality of discontinuous slots 184, 185, wherein the plurality of cathode layers 19 are discontinuous cathode layers.

An organic barricade 20 is formed in the discontinuous slots 184, 185 and on the discontinuous slots 184, 185, and the organic barricade 20 is higher than the cathode layer 19.

The OLED array substrate 100 further includes a first inorganic layer 21, an organic layer 22 and a second inorganic layer 23, wherein the first inorganic layer 21 covers the plurality of cathode layers 19 and the organic barricade 20. The first inorganic layer 21 may also cover a portion of the TFT layer 12 and/or the insulating layer 13, and cover the barricade formed by the first protrusion 153. The organic layer 22 is formed on the first inorganic layer 21. The organic layer 22 covers an area from the first inorganic layer 21 above the first slot 151 to the organic barricade 20. A second inorganic layer 23 is formed on the organic layer 22, and the second inorganic layer 23 covers the organic layer 22 and the first inorganic layer 21. The second inorganic layer 23 may further cover the bending area including a barricade formed by the first protrusion 153.

As mentioned above, by means of providing slots at the pixel defining layer and disposing a plurality of fillers in the slots to form a plurality of discontinuous slots, a plurality of discontinuous cathode layers can be formed on the pixel defining layer. Accordingly, when the cathodes on the surface of the pixel defining layer away from the display area are corroded, the function of the cathodes in the display area would not be affected in such a manner that the display effect of the display device would not be affected. Thus, the OLED array substrate would not be restricted by the thin film encapsulation layer covering the cathodes at the lower bezel so that a narrower lower bezel can be achieved. Besides, the convex barricade formed at the pixel defining layer can further prevent the encapsulated organic layer from overflowing.

The present invention has been described by the above related embodiments. However, the above embodiments are merely examples for implementing the present invention. It should be noted that many changes and modifications to the described embodiment can be carried out without departing from the scope and the spirit of the invention that is intended to be limited only by the appended claims.

What is claimed is:

1. A method of manufacturing an organic light-emitting diode (OLED) array substrate, comprising steps of:

providing a substrate, wherein a thin-film transistor layer is formed on the substrate, an insulating layer is formed on a portion of the thin-film transistor layer, an anode layer is formed on a portion of the insulating layer and is connected to the thin-film transistor layer, and a pixel defining layer is formed on the thin-film transistor layer, the insulating layer and the anode layer;

removing a portion of the pixel defining layer to form a first slot on the anode layer and forming a second slot beside the first slot;

forming a light-emitting layer in the first slot, and manufacturing a plurality of fillers in the second slot, wherein two adjacent ones of the plurality of fillers form a slot together, so as to form a plurality of discontinuous slots in the second slot, and each one of the plurality of discontinuous slots is an isosceles trapezoid; and forming a plurality of cathode layers on the pixel defining layer and in the first slot and the second slot, wherein the plurality of cathode layers are discontinuous cathode layers.

2. The method of manufacturing the OLED array substrate according to claim 1, after the step of forming the plurality of cathode layers, further comprising a step of forming an organic barricade in the discontinuous slots and on the discontinuous slots.

3. The method of manufacturing the OLED array substrate according to claim 2, after the step of forming the organic barricade, further comprising a step of forming an organic layer to cover the first slot and the organic barricade.

4. The method of manufacturing the OLED array substrate according to claim 3, before the step of forming the organic layer, further comprising a step of forming a first inorganic layer on the pixel defining layer, wherein the first inorganic layer covers the plurality of cathode layers and the organic barricade.

5. The method of manufacturing the OLED array substrate according to claim 3, after the step of forming the organic layer, further comprising a step of forming a second inorganic layer on the organic layer, wherein the second inorganic layer covers the organic layer and the first inorganic layer.

6. An organic light-emitting diode (OLED) array substrate, comprising:

a substrate;

a thin-film transistor layer formed on the substrate;

an insulating layer formed on a portion of the thin-film transistor layer;

an anode layer formed on a portion of the insulating layer and connected to the thin-film transistor layer;

a pixel defining layer formed on the thin-film transistor layer, the insulating layer and the anode layer; wherein the pixel defining layer has a first slot and a second slot, a light-emitting layer is formed in the first slot, a plurality of fillers are provided in the second slot, wherein two adjacent ones of the plurality of fillers form a slot together, so as to form a plurality of discontinuous slots in the second slot, and each one of the plurality of discontinuous slots is an isosceles trapezoid; and a plurality of cathode layers formed on the pixel defining layer and in the first slot and the second slot, wherein the plurality of cathode layers are discontinuous cathode layers.

7. The OLED array substrate according to claim 6, wherein the first slot and the second slot are in inverted trapezoidal shapes, and the plurality of fillers are in inverted triangular shapes or in inverted trapezoidal shapes.

8. The OLED array substrate according to claim 6, further comprising an organic barricade, and the organic barricade is disposed in the discontinuous slots and on the discontinuous slots.

9. The OLED array substrate according to claim 8, further comprising an organic layer, and the organic layer covers the first slot and the organic barricade.

10. The OLED array substrate according to claim 9, further comprising a first inorganic layer and a second inorganic layer, wherein the first inorganic layer covers the plurality of cathode layers and the organic barricade and the second inorganic layer covers the organic layer and the first inorganic layer.

11. An organic light-emitting diode (OLED) array substrate, comprising:

a substrate;

a thin-film transistor layer formed on the substrate;

an insulating layer formed on a portion of the thin-film transistor layer;

an anode layer formed on a portion of the insulating layer and connected to the thin-film transistor layer;

a pixel defining layer formed on the thin-film transistor layer, the insulating layer and the anode layer; wherein the pixel defining layer has a first slot and a second slot, and the first slot and the second slot are in inverted trapezoidal shapes; a light-emitting layer is formed in the first slot; a plurality of fillers are provided in the second slot, and the plurality of fillers are in inverted triangular shapes or in inverted trapezoid shapes, wherein two adjacent ones of the plurality of fillers form a slot together, so as to form a plurality of discontinuous slots in the second slot, and each one of the plurality of discontinuous slots is an isosceles trapezoid;

an organic barricade provided in the discontinuous slots and on the discontinuous slots; and a plurality of cathode layers formed on the pixel defining layer and in the first slot and the second slot, wherein the plurality of cathode layers are discontinuous cathode layers.

12. The OLED array substrate according to claim 11, further comprising an organic layer, and the organic layer covers the first slot and the organic barricade.

13. The OLED array substrate according to claim 12, further comprising a first inorganic layer and a second inorganic layer, wherein the first inorganic layer covers the plurality of cathode layers and the organic barricade and the second inorganic layer covers the organic layer and the first inorganic layer.

* * * * *